(12) United States Patent
Katz et al.

(10) Patent No.: US 11,069,507 B2
(45) Date of Patent: Jul. 20, 2021

(54) RADIO-FREQUENCY (RF) TRANSMISSION SYSTEMS, DEVICES, AND METHODS FOR IN SITU TRANSMISSION ELECTRON MICROSCOPY

(71) Applicants: University of Maryland, College Park, College Park, MD (US); National Institute of Standards and Technology, Gaithersburg, MD (US)

(72) Inventors: Michael Katz, Washington, DC (US); Karl Schliep, North Bethesda, MD (US); June Lau, Rockville, MD (US); Jason J. Gorman, Silver Spring, MD (US)

(73) Assignees: University of Maryland, College Park, College Park, MD (US); Government of the United States of America, as represented by the Secretary of Commerce, National Institute of Standards and Technology, Gaithersburg, MD (US)

( * ) Notice: Subject to any disclaimer, the term of this patent is extended or adjusted under 35 U.S.C. 154(b) by 0 days.

(21) Appl. No.: 16/809,736

(22) Filed: Mar. 5, 2020

(65) Prior Publication Data
US 2020/0286706 A1    Sep. 10, 2020

Related U.S. Application Data

(60) Provisional application No. 62/814,152, filed on Mar. 5, 2019.

(51) Int. Cl.
*H01J 37/20* (2006.01)
*H01J 37/26* (2006.01)

(52) U.S. Cl.
CPC .............. *H01J 37/20* (2013.01); *H01J 37/26* (2013.01); *H01J 2237/2008* (2013.01)

(58) Field of Classification Search
CPC ..... H01J 37/20; H01J 37/26; H01J 2237/2008
See application file for complete search history.

(56) References Cited

U.S. PATENT DOCUMENTS 6,317,083 B1 * 11/2001 Johnson ................. H01Q 1/243
343/700 MS

OTHER PUBLICATIONS

Goncalves et al., 'Probing microwave fields and enabling in-situ experiments in a transmission electron microscope' Sep. 11, 2017, Sci Rep. 7: 11064.*

* cited by examiner

*Primary Examiner* — Eliza W Osenbaugh-Stewart
(74) *Attorney, Agent, or Firm* — RowanTree Law Group, PLLC; Frederick F. Rosenberger

(57) ABSTRACT

A sample carrier for in situ transmission electron microscopy (TEM) has a dielectric substrate with a conductive layer that forms a coplanar waveguide. The coplanar waveguide has a first and second leads formed by the conductive layer. The first lead is between an adjacent pair of second leads and is spaced from the second leads by a respective gap. The coplanar waveguide is configured to transmit an electrical signal to a specimen held by the sample carrier, in particular, an electrical signal having a frequency in the radio-frequency (RF) regime (3 kHz-300 GHz), for example, up to 100 GHz. The sample carrier may be mounted to a TEM sample holder, which supports the sample carrier within a vacuum chamber of the microscope and provides electrical connection between the leads of the sample carrier and an RF source external to the vacuum chamber.

20 Claims, 8 Drawing Sheets

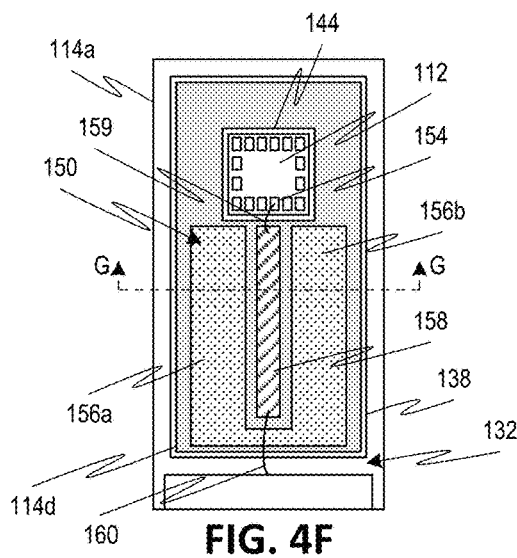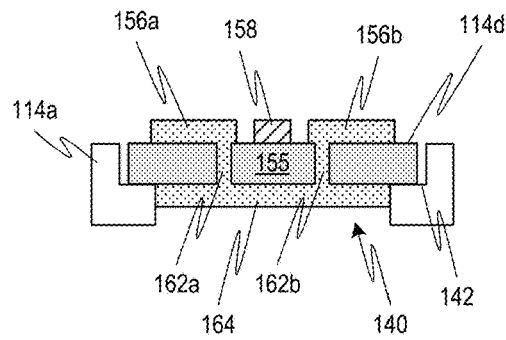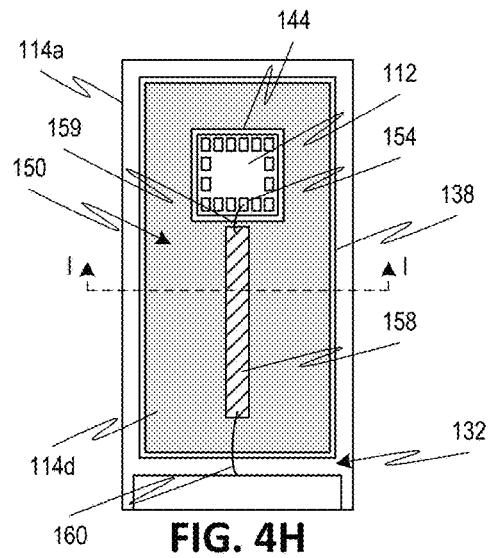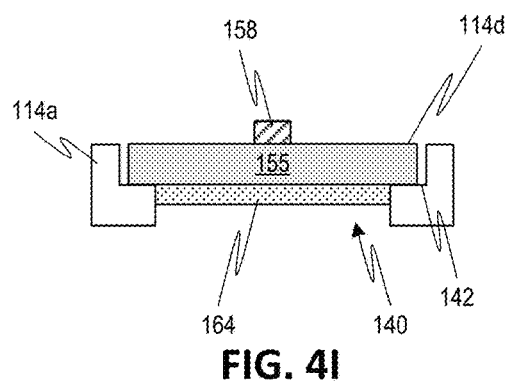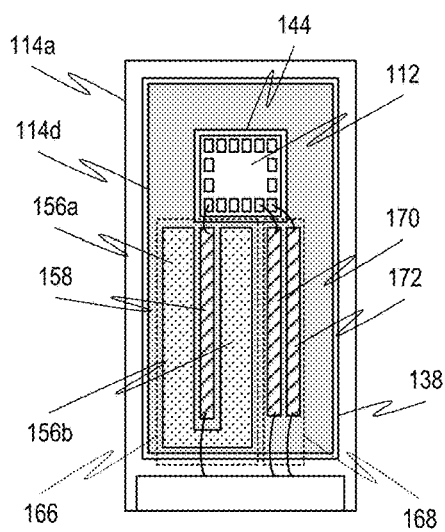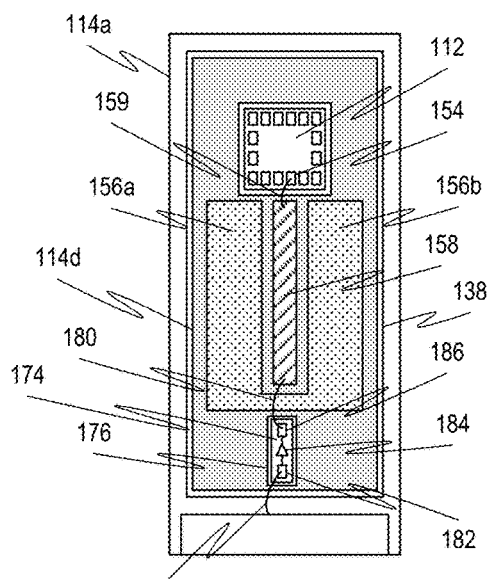

RADIO-FREQUENCY (RF) TRANSMISSION SYSTEMS, DEVICES, AND METHODS FOR IN SITU TRANSMISSION ELECTRON MICROSCOPY

CROSS REFERENCE TO RELATED APPLICATION

The present application claims the benefit of U.S. Provisional Application No. 62/814,152, filed Mar. 5, 2019, which is hereby incorporated by reference herein in its entirety.

STATEMENT REGARDING FEDERALLY SPONSORED RESEARCH

This invention was made with government support under 70NANB16H003 awarded by the National Institute of Standards and Technology (NIST). The government has certain rights in the invention.

FIELD

The present disclosure relates generally to transmission electron microscopes, and more particularly, to radio-frequency (RF) or microwave excitation of a specimen for in situ transmission electron microscopy.

BACKGROUND

The field of electron microscopy has primarily developed around four separate tracks: instrumentation, detector technology, analysis techniques, and in situ capabilities. Past developments along the in situ track have yielded improved capabilities in heating, cooling, straining, high-pressure gas, liquid, electrical biasing, and optical excitation. Yet conventional in situ transmission electron microscopy (TEM) is not able to adequately investigate electrical stimuli in the radio-frequency (RF) or microwave regime. While many modern electronic devices employ RF signals, the lack of existing in situ capabilities in the RF regime prevent TEM characterization of such devices, for example, to microscopically investigate interactions between RF stimuli and materials. Embodiments of the disclosed subject matter may address one or more of the above-noted problems and disadvantages, among other things.

SUMMARY

Embodiments of the disclosed subject matter provide a specimen assembly for in situ transmission electron microscopy (TEM) and methods for use thereof in delivering to a specimen within a TEM system broadband alternating (AC) electrical signals in the radio-frequency (RF) or microwave regimes. The specimen assembly mitigates losses that would otherwise occur with high frequency signal transmission in conventional TEM setups. An RF signal can be transmitted from an RF or microwave source through cables within the microscope to a sample holder of the assembly, where a sample carrier mounted on the sample holder conveys the RF signal to a specimen using one or more coplanar waveguides. Thus, the specimen can be interrogated or actuated by the RF signal while in the vacuum chamber of the microscope, thereby allowing subsequent or simultaneous investigation by the electron beam of the microscope for in situ characterization of the specimen.

In one or more embodiments, a specimen assembly for in situ transmission electron microscopy (TEM) comprises a sample carrier. The sample carrier can have a dielectric substrate with a conductive layer that forms a coplanar waveguide. The coplanar waveguide can be configured to transmit an electrical signal to a specimen held by the sample carrier. The coplanar waveguide can have a first lead formed by the conductive layer and a pair of second leads formed by the conductive layer. The first lead can be between the second leads and spaced from the second leads by respective gaps. The electrical signal can have a frequency in the RF regime (3 kHz and 300 GHz), for example, up to 100 GHz.

In one or more embodiments, a method for in situ TEM can comprise mounting a specimen to a sample carrier. The sample carrier can comprise a dielectric substrate with a conductive layer that forms a coplanar waveguide. The coplanar waveguide can be configured to transmit an electrical signal to a specimen held by the sample carrier. The coplanar waveguide can have a first lead formed by the conductive layer and a pair of second leads formed by the conductive layer. The first lead can be between the second leads and spaced from the second leads by respective gaps. The method can further comprise mounting the sample carrier to a TEM sample holder. The TEM sample holder can have a head portion, a back end portion, and a shaft portion between the head and back end portions. The sample carrier can be disposed within a recess of the head portion. The method can further comprise installing the TEM sample holder to a transmission electron microscope such that the sample carrier with specimen is disposed within a vacuum environment of the microscope. The method can also comprise connecting a RF source to a connector of the TEM sample holder. The method can further comprise applying one or more electrical signals from the RF source to the specimen within the transmission electron microscope via the TEM sample holder and the sample carrier. Each electrical signal can have a frequency in the RF regime (3 kHz and 300 GHz), for example, up to 100 GHz.

In one or more embodiments, a method for in situ TEM can comprise, via a sample carrier, applying one or more electrical signals from an RF source to a specimen within a vacuum chamber of a transmission electron microscope. Each electrical signal can have a frequency in the RF regime (3 kHz and 300 GHz), for example, up to 100 GHz. The sample carrier can comprise a dielectric substrate with a conductive layer that forms multiple coplanar waveguides for transmitting the one or more electrical signals to the specimen. The coplanar waveguides can comprise multiple first leads and second leads formed from the conductive layer. Each first lead can be between and spaced from a pair of adjacent second leads by respective gaps. The method can further comprise, at a same time or in response to the applying the one or more electrical signals, irradiating the specimen with an electron beam and detecting the electron beam after passing through the specimen.

Objects and advantages of embodiments of the disclosed subject matter will become apparent from the following description when considered in conjunction with the accompanying drawings.

BRIEF DESCRIPTION OF THE DRAWINGS

Embodiments will hereinafter be described with reference to the accompanying drawings, which have not necessarily been drawn to scale. Where applicable, some elements may be simplified or otherwise not illustrated in order to assist in the illustration and description of underlying features. Throughout the figures, like reference numerals denote like elements.

FIGS. 4F-4G are plan and cross-sectional views, respectively, of an exemplary sample carrier having a single grounded coplanar waveguide, according to one or more embodiments of the disclosed subject matter.

FIGS. 4H-4I are plan and cross-sectional views, respectively, of an exemplary sample carrier having a single microstrip transmission line, according to one or more embodiments of the disclosed subject matter.

FIG. 4J is a plan view of an exemplary sample carrier having separate lead configurations for RF and DC signal transmission, according to one or more embodiments of the disclosed subject matter.

FIG. 4K is a plan view of an exemplary sample carrier having additional circuit elements for interacting with a transmitted RF signal, according to on or more embodiments of the disclosed subject matter.

DETAILED DESCRIPTION

Embodiments of the disclosed subject matter relate to a specimen assembly for radio-frequency (RF) excitation of a specimen for in situ transmission electron microscopy (TEM). The assembly includes a sample carrier that supports the specimen thereon within the vacuum chamber of a transmission electron microscope. A TEM holder supports the sample carrier thereon and conveys an electrical signal from an RF source external to the microscope to an input end of the sample carrier. The sample carrier includes one or more leads (e.g., electrical traces) that transmits the electrical signal to the specimen. In particular, the sample carrier employs one or more coplanar waveguides to transmit the electrical signal, which has a frequency in the RF regime (e.g., 3 kHz-300 GHz) or the microwave regime (e.g., 300 MHz-300 GHz), to terminals on the specimen in a low-loss manner.

During electrical signal transmission to the specimen or shortly thereafter, the specimen can be irradiated with an electron beam from the microscope to perform an in situ (or in operando) analysis of the specimen, for example, as a function of excitation frequency of the transmitted electrical signal. Embodiments of the disclosed subject matter can be used in various applications, such as, but not limited to, the characterization of semiconductor devices (e.g., next generation wireless communication devices that employ graphene or other materials) and magnetic device (e.g., spin valves) at their operating frequencies, high-throughput in situ fatigue testing, and observation of RF phenomena using ultrafast TEM techniques.

Figure 1:
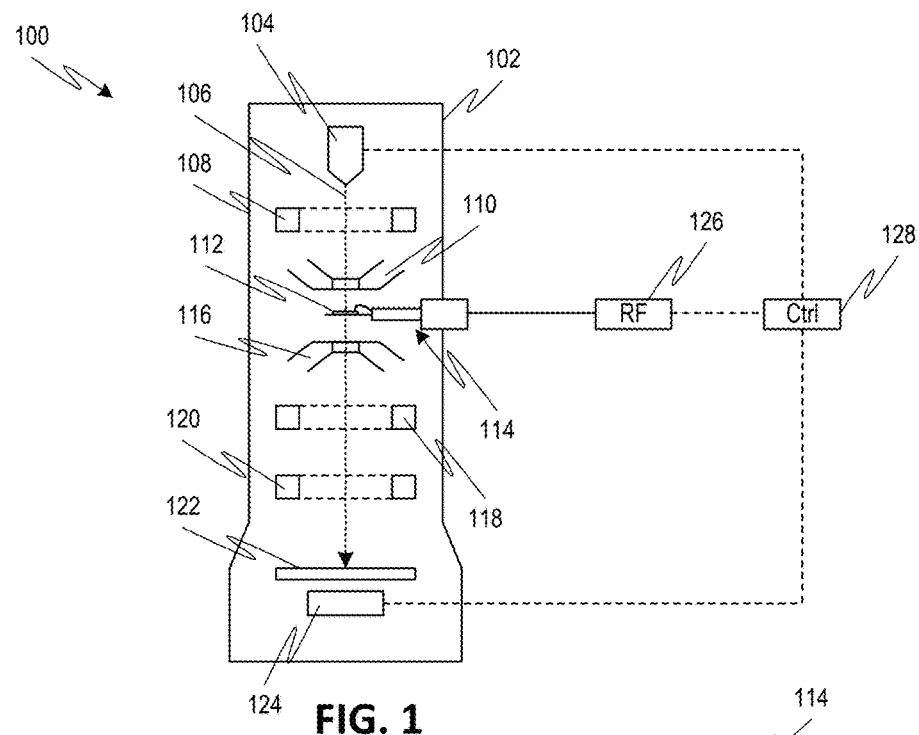
FIG. 1 is a simplified schematic diagram of an in situ transmission electron microscopy (TEM) system, according to one or more embodiments of the disclosed subject matter.

FIG. 1 illustrates a generalized setup of an in situ TEM system 100 employing an exemplary specimen assembly 114. The TEM system 100 includes an electron optical column 102, which houses various components of the system and is maintained under vacuum during interrogation of specimen 112. An electron beam source 104 (e.g., electron gun) can emit an electron beam 106 toward specimen 112 supported within the beam path by assembly 114 between objective lens pole pieces 110, 116. One or more condenser lenses 108 (e.g., magnetic lens) can be used to focus the electron beam 106 onto the specimen 112. The electron beam transmitted through the specimen 112 is collected by one or more intermediate lenses 118 (e.g., magnetic lens) and focused by one or more projector lenses 120 (e.g., magnetic lens) onto a fluorescent screen 122 to convert the electrons into light in the visible regime, which light can be captured by detector 124 (e.g., charge-coupled device (CCD), complementary metal-oxide-semiconductor (CMOS) imager, etc.) and processed into an image by controller 128. Alternatively, detector 124 can be a direct electron detector, such as, but not limited to, a hybrid pixel detector (HPD) or a monolithic active pixel sensor (MAPS), in which case the fluorescent screen 122 may be omitted.

The specimen assembly 114 can be connected to an RF source 126, for example, by one or more coaxial cables. The specimen assembly 114 is configured to transmit an RF electrical signal from the RF source 126 to the specimen 112 while minimizing, or at least reducing, transmission losses. The controller 128 can be operatively coupled to the RF source 126 and/or the electron source 104 for control thereof. For example, the controller 128 can control the RF source 126 to send an RF signal to the specimen 112 via the specimen assembly 114. In some embodiments, source 126 can be configured to generate electrical signals of a variety of different frequencies, for example, from DC (0 Hz) up to 100 GHz. Alternatively or additionally, source 126 can comprise multiple electrical sources, each of which is configured to generate electrical signals in a specific frequency regime (e.g., one source for DC voltage and another source for RF). The specimen assembly 114 is configured to transmit to the specimen the electrical signals from the source 126 over the entire frequency range (e.g., 0 Hz to 100 GHz).

The controller 128 may also control the electron source 104 to simultaneously emit the electron beam 106, such that a TEM analysis can be performed by the microscope system 100 while the specimen 112 is excited or driven by the RF signal. Alternatively or additionally, the controller 128 may control the electron source 104 to emit the electron beam 106 shortly after application of the RF signal to the specimen 112 (e.g., on the order of milliseconds), for example, to perform the TEM analysis subsequent to the RF excitation. In some embodiments, the excitation with the RF signal and/or the emission of electron beam 106 may be substantially continuous when the specimen 112 is within the vacuum environment of the electron optical column 102.

In some embodiments, the controller 128 can control other components of the microscope system 100 and coordinate application of the RF signal therewith. For example, the controller 128 can be operatively coupled to an RF beamline component inserted into the electron optical column 102. The RF beamline component may be connected to RF source 126 to receive an RF signal therefrom, which signal may be the same or different from that transmitted to the specimen 112. For example, the RF beamline component can be configured to "chop" the electron beam 106 into beamlets in order to perform time-resolved TEM imaging. Alternatively or additionally, the RF source 126 can be coupled to one or more deflectors within the TEM system 100, for example, as part of a beat frequency analysis. Other variations for connections to RF source 126 and/or control by controller 128 are also possible according to one or more contemplated embodiments.

Figure 2:
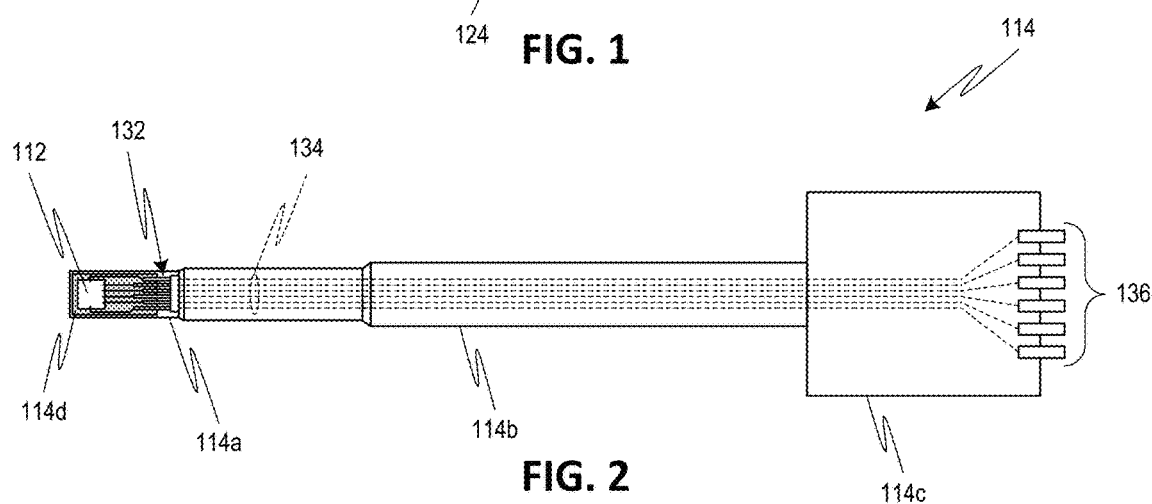
FIG. 2 is a simplified schematic diagram of a TEM holder and sample carrier for use in performing in situ TEM, according to one or more embodiments of the disclosed subject matter.
Figure 3:
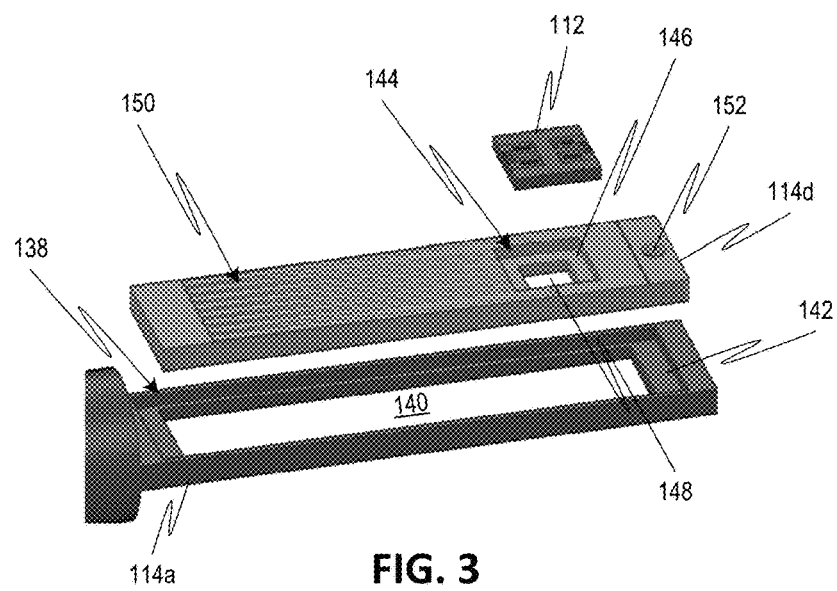
FIG. 3 is an exploded view of a TEM holder, sample carrier, and specimen, according to one or more embodiments of the disclosed subject matter.

FIGS. 2-3 illustrate a simplified configuration of an exemplary specimen assembly 114 that can be used to perform in situ TEM. The specimen assembly 114 includes a TEM holder having a head portion 114a, a back end portion 114c, and an intermediate shaft portion 114b between the head and back end portions. At least the back end portion 114c can be constructed to interface with support structures of the microscope such that the head portion 114a extends into the electron beam path within the electron optical column of the microscope in a substantially cantilever fashion. The back end portion 114c can also include one or more connectors 136 (e.g., RF connectors) to electrical conductors 134 (e.g., RF coaxial cables) that extend within the TEM holder from the back end portion 114c through the shaft portion 114b to the head portion 114a to convey electrical signals to a specimen 112.

The specimen assembly 114 further includes a sample carrier 114d that is mounted at the head portion 114a of the TEM holder. For example, the head portion 114a can include a recess 138 into which the sample carrier 114d fits. A ledge 142 can support the sample carrier 114d within the recess 138. In some embodiments, the specimen assembly 114 can include features that allow securing of the head portion 114a of the TEM holder and sample carrier 114d to each other. For example, the sample carrier 114d can include one or more mounting holes 152, through which a screw or similar fastener can pass to interface with a mounting hole (not shown) of the TEM holder in order to secure the sample carrier 114d to the head portion 114a. Alternatively or additionally, other mechanisms for releasably attaching the sample carrier 114d to the head portion 114a can be used, such as, but not limited to, soldering or an interference fit.

Similarly, the sample carrier 114d can include a recess 144 into which the specimen 112 fits. A ledge 146 can support the specimen 112 within the recess 144. The specimen 112 can be releasably retained within the recess 144 (e.g., when sample carrier 114d is intended to be reused for other specimens) or permanently retained within the recess 144 (e.g., when sample carrier 114d is a one-off test piece). For example, the specimen 112 can be releasably attached within recess 144 of the sample carrier 114d via a solder, an interference fit, or any other reversible attachment means. Alternatively, the specimen 112 can be permanently attached within recess 144 of the sample carrier 114d via, for example, chemical bonding, welding, adhesive, or any other irreversible attachment means.

The head portion 114a can also include a through-hole 140 that overlaps with the recess 138 in plan view, and the sample carrier 114d can also include a through-hole 148 that overlaps with both recesses 138, 144 in plan view. Each through-hole 140, 148 can be designed to allow electrons passing through specimen 112 to proceed uninhibited for detection. In some embodiments, the through-hole 140 may be centered with and fully contained within borders of recess 138 in plan view. In other embodiments, the through-hole 140 may be off center from recess 138, for example, when having a size corresponding to and/or aligned with through-hole 148 of the sample carrier 114d. For example, through-hole 148 can be fully contained within borders of through-hole 140 in plan view.

In some embodiments, the specimen 112 can be mounted to a surface of the sample carrier 114d overlying the through-hole 148 instead of within recess 144. For example, the sample carrier 114d can include a mounting structure, such as one or more pins, ridges, or other protrusions, that functions similarly to the recess 144 to retain the specimen 112 in position on the carrier 114d surface. In some embodiments, through-hole 140 and/or through-hole 148 may be omitted in favor of a thinned layer of material, a TEM grid, or any other electron beam transmissive material. In other embodiments, for example, when applied to an electron microscope that doesn't require electron beam transmission through the specimen (e.g., scanning electron microscope), the through-hole 140 and/or through-hole 148 can be omitted altogether.

The sample carrier 114d can include one or more leads 150 (e.g., conductive traces formed from a metal coating or other conductive layer) on its surface that are coupled to the electrical conductors 134 via one or more respective connections 132. For example, the electrical conductors 134 can be exposed as bare wire at the head portion 114a, which wires are coupled to an input end (e.g., distal from specimen 112) of the one or more leads 150. For example, the conductors 134 can be electrically coupled to the leads 150 of the sample carrier 114d via soldering, conductive adhesive, wirebonding, mechanical contact, or any other electrical coupling means. At an opposite output end (e.g., proximal to specimen 112), the one or more leads 150 are coupled to corresponding terminals on the specimen 112 (e.g., bond pads or the like) via respective wires, for example, via soldering, conductive adhesive, wirebonding, or the like. The leads 150 can be formed from a substantially planar layer of metal, such as, but not limited, to gold, copper, or aluminum. Alternatively or additionally, the leads 150 can be formed from a layer of any conductive material, such as, but not limited to, a doped semiconductor material or a superconducting material.

The sample carrier 114d and its leads 150 are designed to transmit electrical signals received from the electrical conductors 134 via connections 132 to the specimen 112, in particular, signals having a frequency in the RF regime. However, due to transmission line losses and wavelengths nearing the feature sizes of the carrier 114d, the signal transmission properties of the carrier are highly dependent on its geometry and the layout of the leads. To limit power losses resulting from the material of the sample carrier 114d, radiation, and reflections, the sample carrier 114d employs a coplanar waveguide (CPW) structure.

Figure 4A:
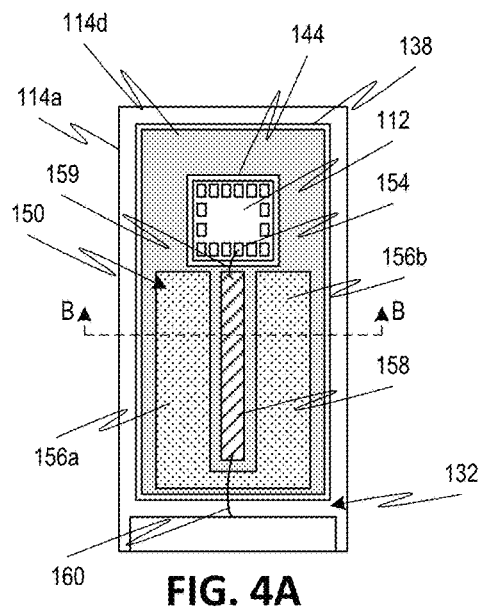
FIGS. 4A-4B are plan and cross-sectional views, respectively, of an exemplary sample carrier having a single coplanar waveguide, according to one or more embodiments of the disclosed subject matter.
Figure 4B:
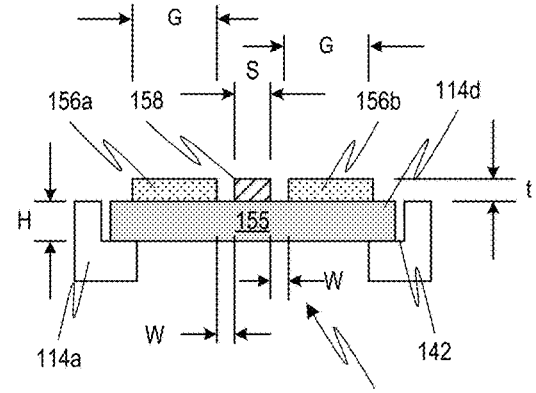

For example, FIGS. 4A-4B show an exemplary configuration of TEM holder head portion 114a and sample carrier 114d employing a single CPW structure. The sample carrier 114d has a dielectric substrate 155 with a thickness, H. On a surface of the substrate 155 is formed a plurality of conductive traces (e.g., metal trace), for example, a single source lead 158 between a pair of ground planes 156a, 156b. The source lead 158 has a width, S, and is separated from each ground plane 156a, 156b by a respective gap having a width, W. An end of the source lead 158 distal from specimen 112 can be coupled to a conductor 134 extending through the specimen assembly 114, for example, via wire 160. The other end of the source lead 158 can be coupled to a terminal 154 of the specimen 112, for example, by wirebonding of a wire 159 thereto.

For the CPW structure illustrated in FIGS. 4A-4B, the conductor width (S), the gap width (W), the substrate thickness (H), and the dielectric constant of the carrier material ($\varepsilon_r$) are related to the characteristic impedance ($Z_0$) through the following equations:

$$Z_0 = \frac{30\pi K(k'_0)}{\sqrt{\varepsilon_{\mathit{eff}}} \, K(k_0)} \quad (1)$$

$$\varepsilon_{\mathit{eff}} = 1 + \frac{(\varepsilon_r - 1)}{2} \frac{K(k'_1)}{K(k_1)} \frac{K(k_0)}{K(k'_0)} \quad (2)$$

In equation (1) and (2), $\varepsilon_{\mathit{eff}}$ is the effective dielectric constant and is dependent on the geometric parameters $K_0$, $k_1$, and $k'$, which are given as:

$$k_0 = \frac{S}{S + 2W} \quad (3)$$

$$k_1 = \frac{\sinh\left(\frac{\pi S}{4H}\right)}{\sinh\left(\frac{\pi(S+2W)}{4H}\right)}$$

$$k' = \sqrt{1 - k^2}.$$

Finally, K(k) is the complete elliptical integral of the first kind. Using these equations and the physical constraints of the sample carrier 114d and specimen assembly 114 generally, a feasible parameter space can be explored, as discussed in further detail below.

Figure 4C:
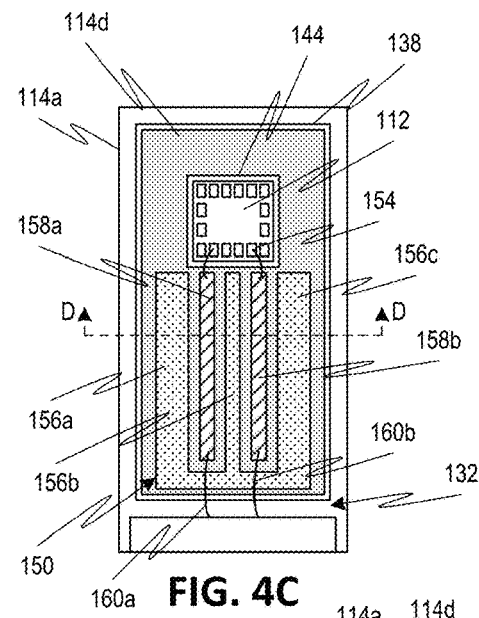
FIGS. 4C-4D are plan and cross-sectional views, respectively, of an exemplary sample carrier having multiple coplanar waveguides, according to one or more embodiments of the disclosed subject matter.
Figure 4D:
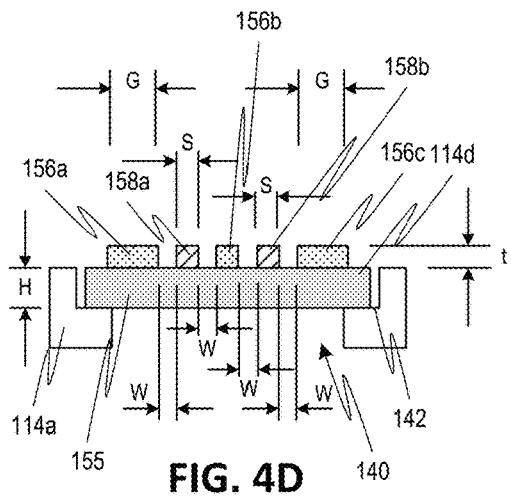

Although FIGS. 4A-4B illustrate a single CPW structure, practical embodiments of the disclosed subject matter may include more than one source lead and pairs of ground planes. For example, FIGS. 4C-4D illustrate an exemplary configuration employing a dual CPW structure, where each source lead 158a, 158b is coupled to a respective terminal 154 of the specimen 112 at one end and coupled to a respective conductor 134 at the opposite end, for example, via wires 160a, 160b. In such a configuration, the ground planes between the adjacent source leads 158a, 158b may be shared. For example, the source lead 158a is disposed between and spaced from ground planes 156a, 156b by respective gaps, and the source lead is disposed between and spaced from ground planes 156b, 156c by respective gaps. As with the configuration of FIGS. 4A-4B, each source lead 158a, 158b can have a width S and can be spaced from the adjacent ground planes 156a-156c by gaps of width W.

Figure 4E:
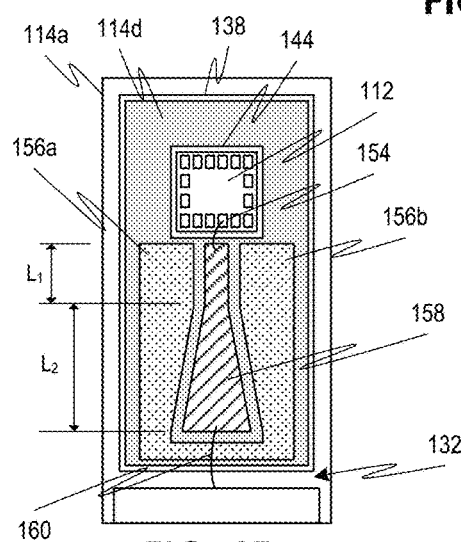
FIG. 4E is a plan view of an exemplary sample carrier having a tapered lead, according to one or more embodiments of the disclosed subject matter.

Although FIGS. 4A-4D illustrate leads 158 and ground planes 156 that have a substantially constant width along its length, it may be advantageous in some embodiments to have a variable width. For example, a larger width for the source lead 158 may be desirable at the end distal from the specimen 112 to assist in coupling to an end of conductor 134 from the shaft portion 114b, whereas a smaller width may be desirable at the end proximal to the specimen 112 for optimal transmission of an RF signal. In some embodiments, the source lead 158 may thus be gradually tapered (e.g., linearly tapered) along at least a portion of its length, for example, as shown in FIG. 4E. The gradual tapering may be effective to minimize or at least reduce any back reflection of the RF signal transmitted by the source lead 158 while accommodating the desired different widths of the source lead 158. The ground planes 156a, 156b may adopt a complementary shape to the source lead 158 to maintain the desired width of the gap with the source lead 158. In some embodiments, the length, $L_2$, over which the source lead 158 is tapered is greater than a length, $L_1$, over which the source lead 158 has a constant width. For example, the tapered portion can be greater than half of an overall length of the source lead 158. In some embodiments, the source lead 158 can include a substantially constant first width section at the end distal from the specimen 112 and a substantially constant second width section at the end proximal to the specimen 112. A tapered section can extend between and connect the first width section to the second width section.

Although FIGS. 4A-4E illustrate leads 150 configured as a coplanar waveguide for RF signal transmission, embodiments of the disclosed subject matter are not limited thereto. Indeed, other RF/microwave transmission line configurations can also be used according to one or more contemplated embodiments. For example, the sample carrier 114d can employ a grounded coplanar waveguide configuration, where a monolithic ground plane 164 is disposed on a backside of substrate 155 and is electrically coupled to ground planes 156a, 156b on the topside of substrate 155, as shown in FIGS. 4F-4G. The backside ground plane 164 can be physically connected to the topside ground planes 156a, 156b by one or more vias 162a, 162b that extend through a thickness of the substrate 155. Alternatively or additionally, the ground planes 164 and 156a-156b can be connected via portions that extend over one or more side edges of the substrate 155. In another example, the sample carrier 114d can employ a microstrip configuration, where the monolithic ground plane 164 is disposed on the backside of substrate 155 without any ground planes on the topside of substrate 155, as shown in FIGS. 4H-4I.

Although the source leads 158 in each of FIGS. 4A-4I is primarily designed to transmit RF signals, the source leads 158 can also be used to transmit lower frequency or no frequency signals. Thus, the sample carrier 114d can be used to deliver signals from DC up to 100 GHz to the specimen 112. However, in some embodiments, it may be beneficial to simultaneously apply DC voltages to the specimen 112 while separately applying RF signals to the specimen 112. For example, the sample carrier 114d can employ a first transmission line configuration 166 designed to transmit RF signals to the specimen, and a separate second transmission line configuration 168 designed to bias the specimen 112 with a DC voltage, as illustrated in FIG. 4J. The first transmission line configuration 166 illustrated in FIG. 4J has the coplanar waveguide configuration of FIGS. 4A-4B, with source lead 158, between ground planes 156a, 156b, electrically connected to the specimen 112 at one end and electrically connected to a conductor of the TEM sample holder at the other. However, any of the other RF transmission line configurations illustrated in FIGS. 4C-4I are also possible. The second transmission line configuration 168 can have a conventional configuration without any ground planes for transmission of DC signals. For example, FIG. 4J illustrates a pair of leads 170, 172 for the second transmission line configuration 168. Each lead 170, 172 can be electrically connected to the specimen 112 at one end and electrically connected to a respective conductor of the TEM sample holder at the other. The DC biasing leads 170, 172, the RF transmission lead 158, and the ground planes 156a, 156b may also be formed from the same layer of conductive material, for example, via patterning and etching to define the desired geometries. Although a particular number of leads for RF and DC signal transmission are shown in FIG. 4J, any number of leads are possible according to one or more contemplated embodiments.

In some embodiments, it may be desirable to include circuitry on the sample carrier 114d to interact with the transmitted RF signal and/or the specimen 112. Such circuitry may be integrally formed on the sample carrier 114d (for example, over a topside or backside surface of the dielectric substrate and connected with the RF transmission lead, such as by a multilayer interconnect system, a via interconnect, or via wirebonding) or formed as a separate chip coupled to the sample carrier 114d (for example, disposed on a topside surface or within a recess on the topside surface of the dielectric substrate). For example, the sample carrier 114d can have a recess 176 into which a semiconductor chip 174 is disposed, as illustrated in FIG. 4K. The semiconductor chip 174 can have one or more circuits 184, for an example, an amplifying circuit, configured to interact with an RF signal. The semiconductor chip 174 can have an input terminal 182 (e.g., bond pad) electrically connected to a respective conductor of the TEM sample holder, for example, via wire 178. The semiconductor chip 174 can have an output terminal 186 (e.g., bond pad) electrically connected to an input end of the source lead 158 of the coplanar waveguide, for example via wire 180. An RF signal delivered via the conductor of the TEM sample holder can thus be processed by semiconductor chip 184 (e.g., amplified) before being transmitted to the specimen 112 by the signal lead 158 of the coplanar waveguide. Other chip functionalities and arrangements are also possible according to one or more contemplated embodiments.

Although the features of FIGS. 4A-4K have been illustrated separately, the inclusion of one feature does not preclude the use of the other. Indeed, features from any of FIGS. 4A-4K can be combined together in certain embodiments. For example, the tapered features of FIGS. 4E could be applied to the RF transmission line configurations of FIGS. 4C-4D and 4F-4K. In another example, the multiple source lead configuration of FIG. 4C-4D could be applied to the RF transmission line configurations of FIGS. 4F-4K. In still another example, the RF transmission line configurations of FIGS. 4F-4I could be used in the sample carriers of FIGS. 4J-4K. In some embodiments, different RF transmission line configurations can be combined on the sample carrier, for example, by combining FIGS. 4A, 4F, and/or 4H. Thus, embodiments of the disclosed subject matter are not limited to the configurations separately illustrated in the figures; rather, embodiments include all practical combinations of the features illustrated in the figures or otherwise described herein. Indeed, the various combinations of RF transmission line configurations, DC biasing leads, and/or supplemental circuitry can allow a user to customize the sample carrier to a particular experiment and/or specimen.

FIGS. 5A-5D illustrate a particular exemplary configuration of a sample carrier 114d with eight coplanar waveguides formed by source leads 158 between pairs of ground planes 156. Each source lead 158 has a first section at end 162 distal from recess 144 where the specimen will be disposed, and a second section at end 164 proximal to recess 144. The first section has a substantially constant first width while the second section has a substantially constant second width that is less than the first width. Between the first and second sections, each source lead 158 has a variable width that gradually tapers from the first width to the second width. To accommodate different geometries for specimen 112, the outermost leads adjacent to edges of the sample carrier 114d can be bent at 168 so as to be substantially perpendicular to the other leads as they approach the specimen 112. The leads 158 can be arranged such that specimen 112 has a four-fold rotational symmetry with respect to the sample carrier 114d, thereby allowing for additional experimentation sites on each specimen. The eight leads 158 can thus enable experimentation on different regions of the same specimen 112 and can allow for more complex electrical stimuli and measurements.

Figure 5A:
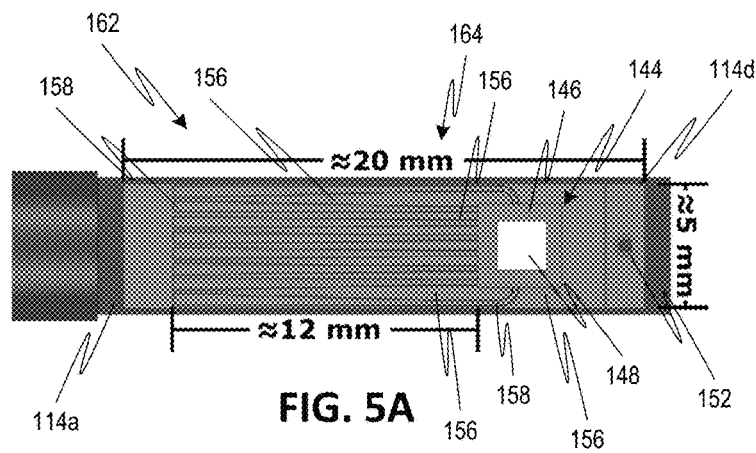
FIG. 5A is a plan view of an exemplary sample carrier with multiple coplanar waveguides installed in a TEM sample holder, according to one or more embodiments of the disclosed subject matter.
Figure 5B:
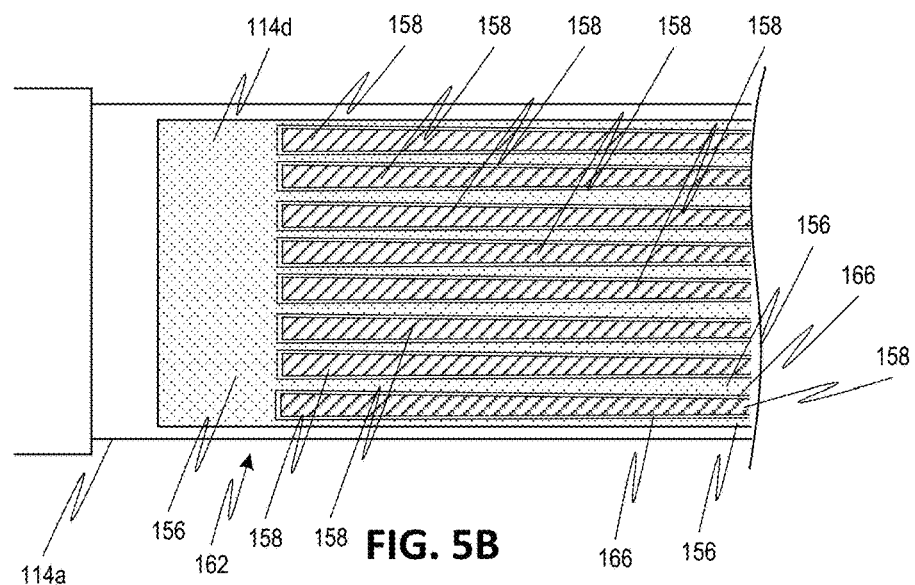
FIGS. 5B-5C are close-up plan views of an input end portion and a specimen support portion, respectively, of the sample carrier of FIG. 5A.
Figure 5C:
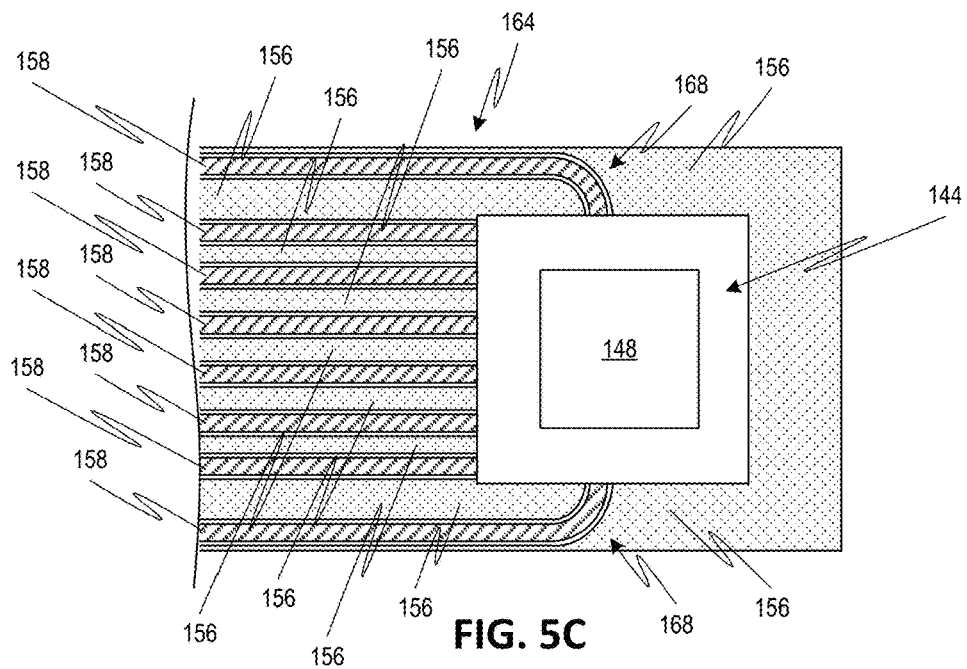
Figure 5D:
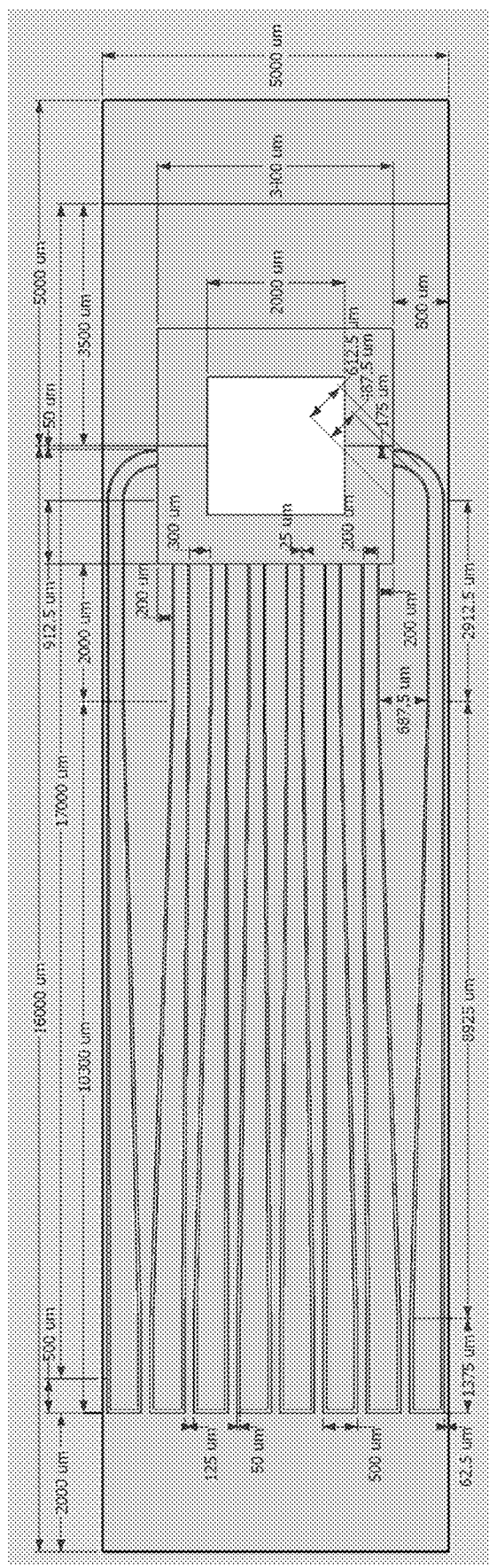
FIG. 5D is a plan view with exemplary dimensions for the sample carrier of FIG. 5A.

Dimensions of the sample carrier 114d, as well as dimensions and location of through-hole 140 and/or through-hole 146, may tailored to match the configuration of the TEM system into which the specimen assembly 114 is installed and/or dimensions of the specimen 112. For example, FIG. 5D illustrates dimension of an exemplary sample carrier that can be used in a JEOL TEM system with a 2 mm objective pole-piece gap. For example, contact pads for the source leads are 1.375 mm in length with conductor widths (S) and gaps (W) of 400 μm and 50 μm, respectively, to provide a large area for making perpendicular contact with each CPW. The dimensions, S and W, are then reduced to 200 μm and 25 μm at a taper of about 22 μm/mm and 2.8 μm/mm, respectively, over 8.925 mm. The six inner leads then continue 2 mm to the 3.4 mm×3.4 mm specimen through-hole. The two outermost leads instead continue 2.9125 mm before curving 90° into the specimen hole along a 3×S radius of curvature. The substrate may have a thickness (H) that is less than or equal to 500 μm. Other TEM systems may require different dimensions or configurations for the sample carrier 114d and/or other components of the specimen assembly 114.

As noted above, the characteristic impedance of the CPW structure is related to the conductor width (S), the gap width (W), the substrate thickness (H), and the dielectric constant ($\varepsilon_r$) of the substrate material. For example, in the configuration of FIGS. 5A-5D, eight source leads are spread out across a 5 mm width of the sample carrier 114d. The width (L) of each CPW, which is defined as the width (S) of the source lead plus the width (W) of each gap plus half of the width (G) of each ground plane (e.g., L=S+2W+G), is thus limited to 625 µm (i.e., 5 mm/8). Using equation (1) above and setting $Z_0$=0, the dimensional parameter space of the CPW structure can be determined.

Figure 8A:
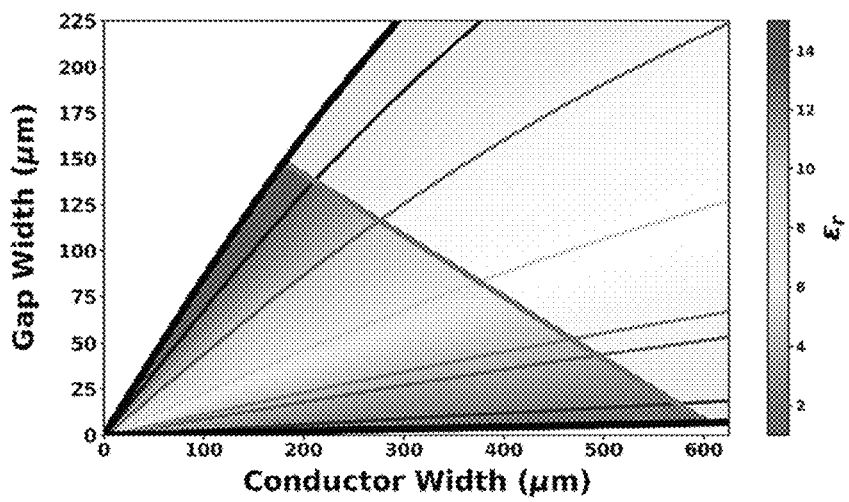
FIG. 8A is a contour plot of the coplanar waveguide dimensional parameter space defined by lead width (S), gap width (W), dielectric constant ($\varepsilon_r$), and the total width of the coplanar waveguide (e.g., L=S+3W).

The variation of $\varepsilon_r$ with different spatial dimensions of the CPW are shown within the dielectric constant range (1<$\varepsilon_r$<15) in FIG. 8A, delimited by thick black contours. The contour lines outline regions of constant $\varepsilon_r$ for CPW with a 50Ω characteristic impedance. The contours are bound by two solid black curves (for $\varepsilon_r$=1 and $\varepsilon_r$=15), outlining a feasible $\varepsilon_r$ range. The contours correspond to the dielectric constants for exemplary materials for the sample carrier substrate, in particular, polytetrafluoroethylene (PTFE) ($\varepsilon_r$=2, shown in maroon), quartz ($\varepsilon_r$=3.8, shown in red), FR-4 glass epoxy ($\varepsilon_r$=4.4, shown in orange), beryllia ($\varepsilon_r$=6.7, shown in green), alumina ($\varepsilon_r$=10, shown in blue), and gallium arsenide (GaAs, shown in purple) ($\varepsilon_r$=13.1).

In some embodiments, the width of the ground plane can be equal to the width of the gap (e.g., G=W), such that the CPW width is given by L=S+3W. In FIG. 8A, the triangle formed by the grey line intercepting all contours defines the region where the CPW width L=S+3W. Using this parameter space and the six substrate materials, the transmission properties of multiple CPW can be explored to determine an optimal design for sample carrier 114d that minimizes, or at least reduces, loss in transmission of RF signals to the specimen.

Figure 6:
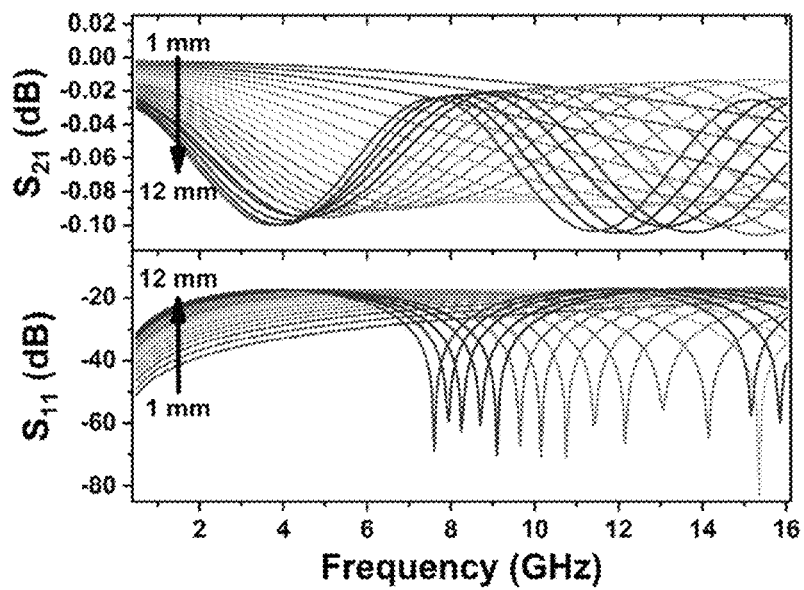
FIG. 6 are graphs of simulated S-parameters for transmission ($S_{21}$) and reflection ($S_{11}$) of electrical power as a function of electrical signal frequency for various lengths of a coplanar waveguide having a lead width of 400 µm and gap of 50 µm.

FIG. 6 shows graphs of simulated S-parameters for transmission ($S_{21}$) and reflection ($S_{11}$) of electrical power as a function of electrical signal frequency for various lengths of a CPW having a source lead width (S) of 400 µm and gap width (W) of 50 µm. As shown in FIG. 6, there is a systematic increase in losses in the $S_{21}$ parameter as the length of the CPW increases. Additionally, the frequency responses become sinusoidal as the length increases. However, these additional losses due to longer CPW are relatively small. Indeed, since they result in no more than 3% loss for certain frequencies, they may in general be ignored.

Figure 7:
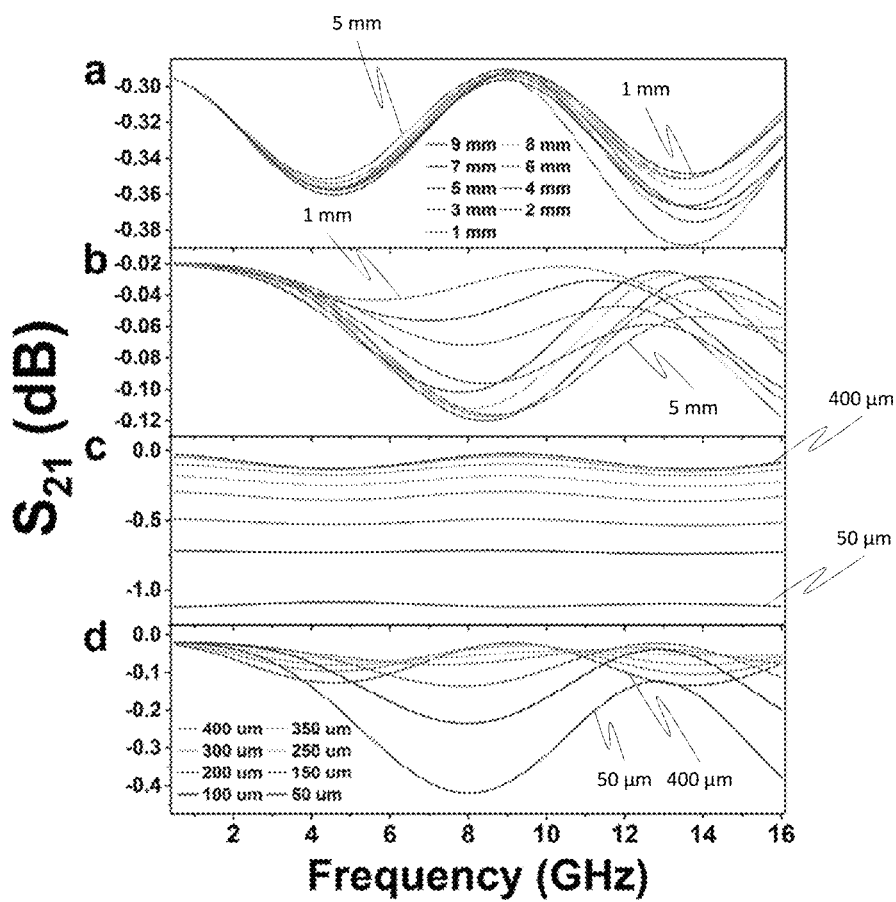
FIG. 7 shows graphs of simulated S-parameters for transmission ($S_{21}$) of electrical power as a function of electrical signal frequency for various lengths of a coplanar waveguide that has a lead width that tapers from 400 µm to 200 µm at a constant impedance of 50 ohms (panel a) and at a constant gap width of 50 µm (panel b), and for various taper widths of the coplanar waveguide that has a constant length of 10 mm and at a constant impedance of 50 ohms (panel c) and at a constant gap width of 50 µm (panel d).

FIG. 7 shows graphs of simulated S-parameters for transmission ($S_{21}$) of electrical power as a function of electrical signal frequency for various lengths of a CPW that has a source lead width that tapers from 400 µm to 200 µm at a constant impedance of 50Ω (panel a) and at a constant gap width of 50 µm (panel b), and for various taper widths of the source lead of the CPW, which has a constant length of 10 mm, at a constant impedance of 50 ohms (panel c) and at a constant gap width of 50 µm (panel d). As suggested by FIG. 7, varying the length of the taper (e.g., effectively varying the angle of taper) may have a minimal effect on the scattering pattern for the CPW (having a total length of 10 mm) when impedance is kept constant at 50Ω. However, if the taper gap is fixed at 50 µm while the conductor tapers, a more pronounced effect may be observed, as suggested by panels a and b. However, this effect may have relatively little impact on the total transmission. For a fixed taper length of 10 mm, the effect of the amount of taper can be seen in panels c and d for a constant impedance of 50Ω and a constant gap width of 50 µm, respectively. Varying the end conductor width produced a much stronger effect that could lead to upwards of 20% loss.

Figure 8B:
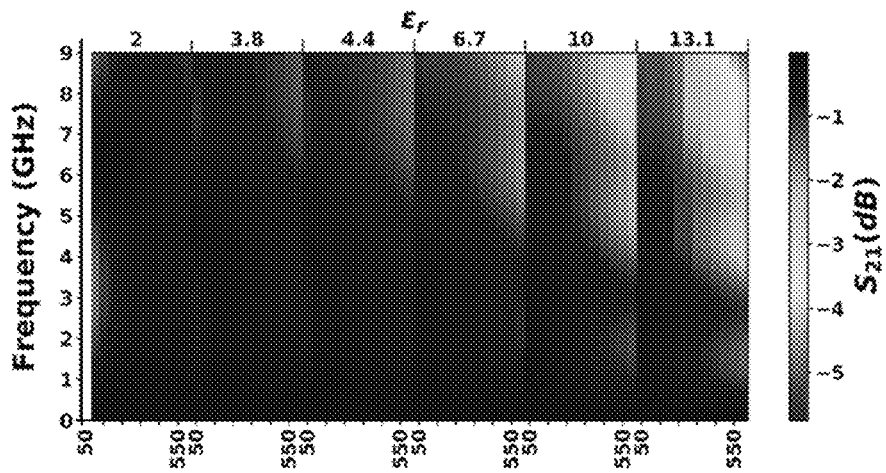
FIG. 8B is a contour plot of simulated insertion loss ($S_{21}$) of coplanar waveguide structures for six different substrate materials ($\varepsilon_r$=2, 3.8, 3.3, 6.7, 10, 13.1) and for various lead widths.

FIG. 8B is a contour plot of simulated insertion loss ($S_{21}$) of coplanar waveguide structures for six different substrate materials ($\varepsilon_r$=2, 3.8, 3.3, 6.7, 10, 13.1) and for various lead widths, in particular, conductor widths (S) ranging from 50-600 µm in 50 micron increments (12 total S values) for each of substrate material. The gap widths (W) for each simulation were chosen such that the resulting CPW had $Z_0$=50Ω, by solving equation (1) for W for each conductor width (e.g., twelve different S values) and for each substrate material (e.g., six different $\varepsilon_r$ values). The carrier length was set at 10 mm long. The substrate thickness (H) was set as 500 µm. The gap width (W) was varied so that there was a ground trace having a width of G=W between the CPW gap and the edge of the substrate. As suggested by FIG. 8B, insertion loss generally increases with increasing $\varepsilon_r$, loss increases with increasing conductor widths, and loss increases for CPW structures with low $\varepsilon_r$ and small S (and commensurately small W).

Figure 8C:
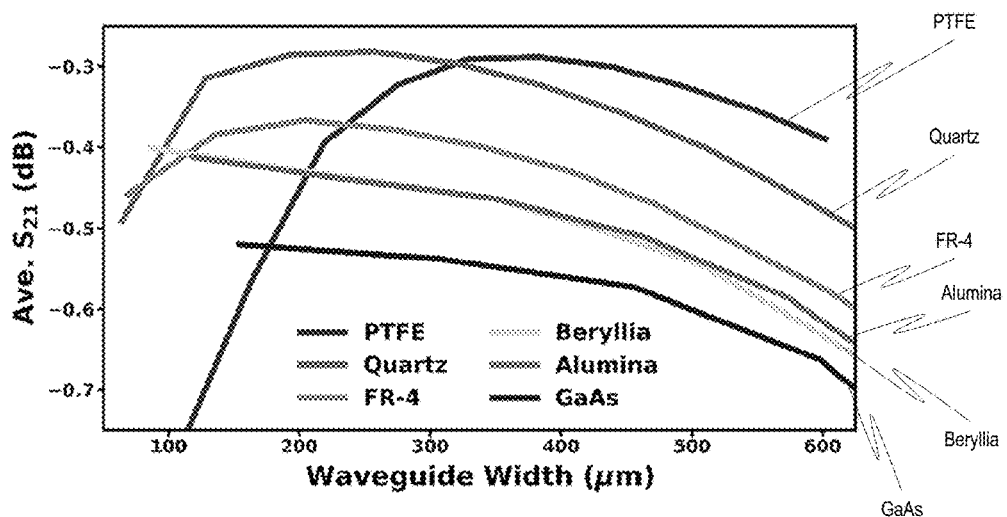
FIG. 8C is a graph of total width of a coplanar waveguide versus frequency averaged insertion loss ($S_{21}$) for the six different substrate materials.

To better understand average performance over the entire simulated frequency range, an average transmission coefficient $S_{21-avg}$ was calculated based on the $S_{21}$ averaged across the entire frequency range for each material and for each of the CPW widths investigated. The relationship between source lead width S of the CPW, and the frequency-averaged transmission for the six dielectric materials is shown in FIG. 8C. As suggested by FIG. 8C, large losses may result for configurations where $\varepsilon_r$=2 and S=50 µm and W=1.6 µm. FIG. 8C also suggests that increasing the dielectric constant of the substrate (e.g., going from PTFE to GaAs), generally increases the average insertion losses for all CPWs with source lead width (S) greater than 300 µm. For the same insertion loss, the overall CPW width may be reduced by using a material with a higher dielectric constant. FIGS. 8A-8C further suggests that an optimal configuration for the sample carrier 114d may be a dielectric substrate of quartz substrate, with a source lead of the CPW having a width (S) of 200 µm and a gap width (W) of 19 µm.

To experimentally test these results, sample carriers 114d (i.e., RF carrier) according to the configuration of FIG. 5D were fabricated by laser cutting and mounted to the head portion 114a of a TEM holder. Using a vector network analyzer (VNA), the performance of the fabricated RF carriers 114d were compared against conventional DC biasing sample carriers. The RF carrier 114d and the conventional DC biasing carrier were both formed with gold-coated copper layer covering a dielectric substrate of FR-4 glass epoxy. The VNA measured the return loss ($S_{11}$) of both carrier types over a frequency range of 0.1-9 GHz. A mini-coaxial cable was used to measure the reflected power ($S_{11}$) of the TEM holder without an inserted carrier for each input in order to yield a baseline value for the measurement setup. Each scan used a 1 kHz intermediate frequency, a power of 0.1 mW, and was signal averaged over four measurements. The RF cables connecting the RF power source with the connectors of the TEM holder inserted in the TEM system were 2.5 m long.

Figure 9A:
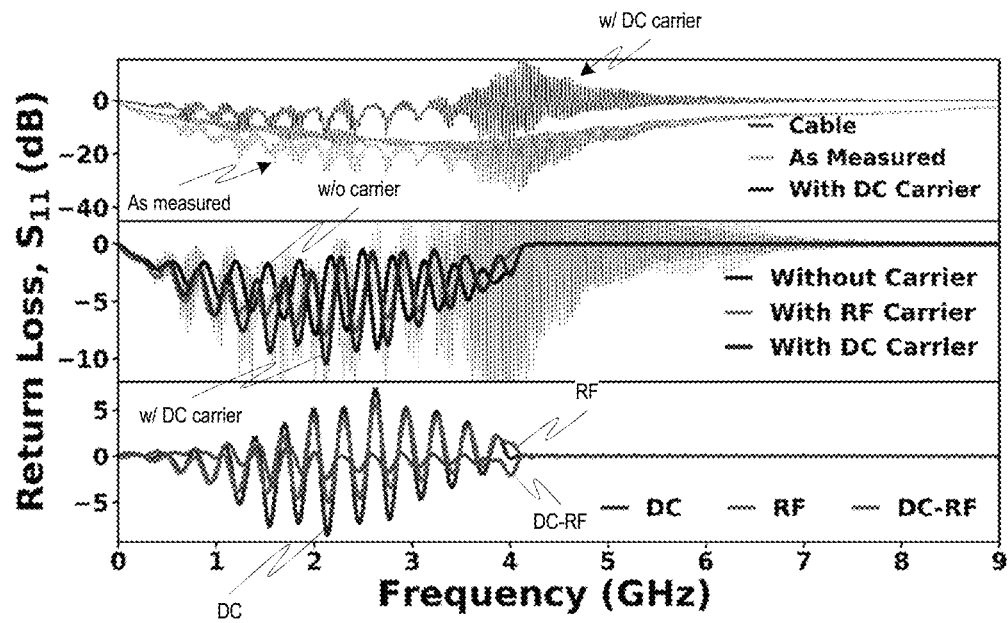
FIG. 9A is a graph of reflected power ($S_{11}$) for various testing setups comparing performance for a standard sample carrier and for the sample carrier of FIG. 5D.

FIG. 9A shows the results of the experimental comparison of the RF carrier 114d and the conventional DC biasing carrier. In the top panel of FIG. 9A, three reflected power ($S_{11}$) loss spectra are shown, corresponding to the 2.5 m RF cable alone ("Cable"), the TEM holder plus the conventional DC biasing carrier ("With DC Carrier"), and the complete assembly of RF cable, TEM holder, and conventional DC biasing carrier ("As Measured"). Note that the "With DC Carrier" results were obtained by subtracting the "Cable" results from the "As Measured" results. Note that signals above 0 dB are results of signal averaging artefacts rather than signal gain. For the middle and bottom panels of FIG. 9A, a high-pass filter was used to remove oscillations and highlight differences in performance. The measurement procedure was repeated for the RF carriers 114d and the TEM holder alone, as shown in the middle panel of FIG. 9A. Finally, the bottom panel of FIG. 9A was achieved by subtracting the TEM holder plus RF cable measurements to yield a more direct comparison of the conventional DC biasing carrier versus the RF carrier 114d with respect to RF frequencies.

As suggested by the top panel of FIG. 9A, most of the return losses observed (up to −40 dB at 4 GHz) were due to the 2.5 m mini-coaxial cable. The middle panel of FIG. 9A shows the return loss with and without carriers inserted into the TEM holder. As expected, losses increased when any carrier was inserted into the holder, particularly within the 500 MHz to 3.5 GHz range. However, comparison of the performance of the DC biasing carrier with the RF carrier 114d in the bottom panel of FIG. 9A indicates that the return loss is reduced for frequencies above 1 GHz for the RF carrier 114d. The bottom panel of FIG. 9A also illustrates how the carriers oscillate between reflecting and absorbing signals across the 0.5-3.5 GHz band. A positive $S_{11}$ indicates that the carrier reflected more signal back to the launch port than the TEM holder without a carrier installed. A negative $S_{11}$ indicates that the carrier absorbed power that would have been reflected by the TEM holder without a carrier installed.

Figure 9B:
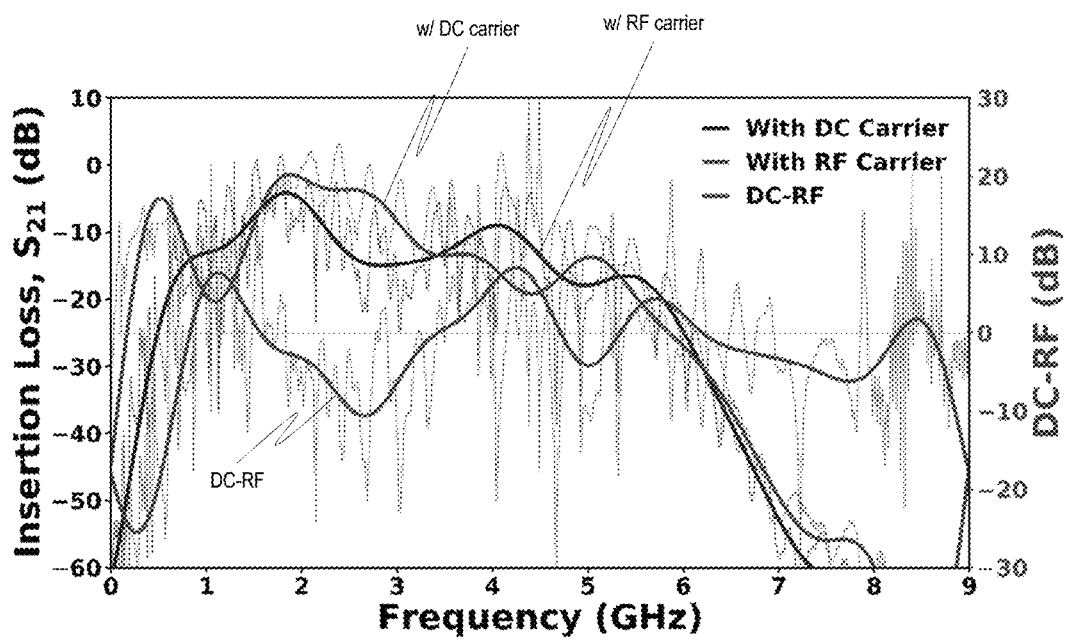
FIG. 9B is a graph of transmitted power ($S_{21}$) across only the standard sample carrier and the sample carrier of FIG. 5D.

Although the above $S_{11}$ results provide information about the losses of each carrier, power transmission ($S_{21}$) measurements may provide a more useful characterization of the carriers. Thus, FIG. 9B provides a graph of transmitted power ($S_{21}$) for a conventional DC biasing carrier and for the RF carrier 114d according to FIG. 5D. To measure the transmission properties of the carriers, two adjacent leads were shorted at the through-hole end (e.g., proximal to the specimen location) for both the conventional DC biasing carrier and the RF carrier 114d. The TEM holder and carrier responses were isolated by subtracting the $S_{11}$ losses for each cable from the recorded $S_{21}$ transmission across the carriers. FIG. 9B shows the transmission loss of the conventional DC biasing carrier (blue series), the transmission loss of the RF carriers 114d (green series), and the difference (red series) obtained by subtracting the RF carrier response from the conventional DC biasing carrier response. Note that the negative $S_{21}$ values in the different values correspond to frequencies where the RF carrier 114d transmitted with less loss than the conventional DC biasing carrier.

As suggested by FIG. 9B, both carrier configurations show 30 dB loss above 6 GHz, which loss accelerates rapidly beyond 6 GHz. However, the RF carrier 114d generally outperformed the conventional DC biasing carrier over the frequency bands of approximately 0-0.8 GHz, 1.75-3.4 GHz, and 4.8-5.35 GHz, in particular yielding −20 dB, 3 dB, −7 dB, 4 dB, and −2 dB, respectively, for the RF carrier 114d relative to the conventional DC biasing carrier when averaged over each of the frequency ranges. Indeed, the TEM holder with the RF carrier 114d has an average transmission loss of −13 dB under 6 GHz, while the TEM holder with conventional DC biasing carrier had a transmission loss of −16 dB, a percent difference of 33%.

Although the discussion above has focused on excitation and analysis in the RF regime, embodiments of the disclosed subject matter may instead be applied to electrical signals having a frequency in the microwave regime, for example, between 300 MHz and 300 GHz, inclusive, or 500 MHz up to 100 GHz, inclusive. In such embodiments, the RF source may instead be considered a microwave source, and the RF signals may instead be considered a microwave signal.

While the discussion above has focused on the use of the specimen assembly with a transmission electron microscope, embodiments of the disclosed subject matter are not necessarily limited thereto. Indeed, the disclosed specimen assembly can be used in other applications where low-loss transmission of an RF or microwave signal from a source external to a vacuum environment to a specimen within the vacuum environment is desired. Such applications can include, but are not limited to, other electron microscopes (e.g., scanning electron microscope) or other charged-particle beam apparatuses in general (e.g., ion beam). In such alternative applications for the specimen assembly, the imaging might use transmitted electrons, scattered electrons, secondary electrons, or any other radiation in response to the charged-particle interrogation beam and/or RF drive signal.

Although particular components and configuration have been illustrated in the figures and discussed in detail herein, embodiments of the disclosed subject matter are not limited thereto. Indeed, one of ordinary skill in the art will readily appreciate that different components or configurations can be selected and/or components added to provide the same effect. In practical implementations, embodiments may include additional components or other variations beyond those illustrated, for example, additional focusing elements along the beam path according to a particular microscope configuration. Accordingly, embodiments of the disclosed subject matter are not limited to the particular configurations specifically illustrated and described herein.

It will be appreciated that the aspects of the disclosed subject matter, for example, the control system 128, can be implemented, fully or partially, in hardware, hardware programmed by software, software instruction stored on a computer readable medium (e.g., a non-transitory computer readable medium), or any combination of the above. For example, components of the disclosed subject matter, including components such as a control unit, controller, processor, user interface, or any other feature, can include, but are not limited to, a personal computer or workstation or other such computing system that includes a processor, microprocessor, microcontroller device, or is comprised of control logic including integrated circuits such as, for example, an application specific integrated circuit (ASIC).

Features discussed herein can be performed on a single or distributed processor (single and/or multi-core), by components distributed across multiple computers or systems, or by components co-located in a single processor or system. For example, aspects of the disclosed subject matter can be implemented via a programmed general purpose computer, an integrated circuit device, (e.g., ASIC), a digital signal processor (DSP), an electronic device programmed with microcode (e.g., a microprocessor or microcontroller), a hard-wired electronic or logic circuit, a programmable logic circuit (e.g., programmable logic device (PLD), programmable logic array (PLA), field-programmable gate array (FPGA), programmable array logic (PAL)), software stored on a computer-readable medium or signal, an optical computing device, a networked system of electronic and/or optical devices, a special purpose computing device, a semiconductor chip, a software module or object stored on a computer-readable medium or signal.

When implemented in software, functions may be stored on or transmitted over as one or more instructions or code on a computer-readable medium. The steps of a method or algorithm disclosed herein may be embodied in a processor-executable software module, which may reside on a computer-readable medium. Instructions can be compiled from source code instructions provided in accordance with a programming language. The sequence of programmed instructions and data associated therewith can be stored in a computer-readable medium (e.g., a non-transitory computer readable medium), such as a computer memory or storage device, which can be any suitable memory apparatus, such as, but not limited to read-only memory (ROM), programmable read-only memory (PROM), electrically erasable programmable read-only memory (EEPROM), random-access memory (RAM), flash memory, disk drive, etc.

As used herein, computer-readable media includes both computer storage media and communication media, including any medium that facilitates the transfer of a computer program from one place to another. Thus, a storage media may be any available media that may be accessed by a computer. By way of example, and not limitation, such computer-readable media may comprise RAM, ROM, EEPROM, CD-ROM or other optical disk storage, magnetic disk storage or other magnetic storage devices, or any other medium that may be used to carry or store desired program code in the form of instructions or data structures and that may be accessed by a computer.

Also, any connection is properly termed a computer-readable medium. For example, if the software is transmitted from a website, server, or other remote source using a transmission medium (e.g., coaxial cable, fiber optic cable, twisted pair, digital subscriber line (DSL), or wireless technologies such as infrared, radio, and microwave), then the transmission medium is included in the definition of computer-readable medium. Moreover, the operations of a method or algorithm may reside as one of (or any combination of) or a set of codes and/or instructions on a machine-readable medium and/or computer-readable medium, which may be incorporated into a computer program product.

One of ordinary skill in the art will readily appreciate that the above description is not exhaustive, and that aspects of the disclosed subject matter may be implemented other than as specifically disclosed above. Indeed, embodiments of the disclosed subject matter can be implemented in hardware and/or software using any known or later developed systems, structures, devices, and/or software by those of ordinary skill in the applicable art from the functional description provided herein.

In this application, unless specifically stated otherwise, the use of the singular includes the plural, and the separate use of "or" and "and" includes the other, i.e., "and/or." Furthermore, use of the terms "including" or "having," as well as other forms such as "includes," "included," "has," or "had," are intended to have the same effect as "comprising" and thus should not be understood as limiting.

Any range described herein will be understood to include the endpoints and all values between the endpoints. Whenever "substantially," "approximately," "essentially," "near," or similar language is used in combination with a specific value, variations up to and including 10% of that value are intended, unless explicitly stated otherwise.

It is thus apparent that there is provided, in accordance with the present disclosure, RF transmission systems, devices, and methods for in situ transmission electron microscopy. Many alternatives, modifications, and variations are enabled by the present disclosure. While specific examples have been shown and described in detail to illustrate the application of the principles of the present invention, it will be understood that the invention may be embodied otherwise without departing from such principles. For example, disclosed features may be combined, rearranged, omitted, etc. to produce additional embodiments, while certain disclosed features may sometimes be used to advantage without a corresponding use of other features. Accordingly, Applicants intend to embrace all such alternative, modifications, equivalents, and variations that are within the spirit and scope of the present invention.

The invention claimed is:

1. A specimen assembly for in situ transmission electron microscopy (TEM), the specimen assembly comprising:
   a sample carrier comprising a dielectric substrate with a conductive layer that forms a coplanar waveguide configured to transmit an electrical signal to a specimen held by the sample carrier, the coplanar waveguide having a first lead formed by the conductive layer and a pair of second leads formed by the conductive layer, the first lead being between the second leads and spaced from the second leads by respective gaps,
   wherein the electrical signal has a frequency between 3 kHz and 300 GHz, inclusive.

2. The specimen assembly of claim 1, wherein the sample carrier has a recessed portion configured to hold the specimen therein, and the first and second leads extend from a first region distal from the recessed portion to a second region adjacent to the recessed portion.

3. The specimen assembly of claim 2, wherein a through-hole is formed within the recessed portion, the through-hole allowing an electron beam of a transmission electron microscope to pass through the sample carrier.

4. The specimen assembly of claim 2, wherein the first lead is tapered along at least a portion of its length, such that a width of the first lead at the first region is greater than a width of the first lead at the second region.

5. The specimen assembly of claim 4, wherein the tapered portion is greater than half of an overall length of the first lead.

6. The specimen assembly of claim 4, wherein each second lead is tapered along at least a portion of its length, such that a width of the second lead at the first region is less than a width of the second lead at the second region.

7. The specimen assembly of claim 2, further comprising a specimen disposed in the recessed portion, wherein at least the first lead is electrically coupled to an electrical terminal of the specimen such that the electrical signal is conveyed from the sample carrier to the electrical terminal of the specimen.

8. The specimen assembly of claim 7, wherein the first lead is electrically coupled to the electrical terminal of the specimen via a wirebond.

9. The specimen assembly of claim 1, further comprising:
   a TEM sample holder comprising:
      a head portion with a recess configured to hold the sample carrier therein;
      a back end portion with a radio-frequency (RF) connector, which is configured to connect to an RF source that generates the electrical signal;
      a shaft portion between the head and back end portions; and
      co-axial cabling coupling the RF connector to at least the first lead,
   wherein the back end portion is configured to be disposed outside a vacuum environment of a transmission electron microscope, and the head portion is configured to be disposed inside the vacuum environment of the transmission electron microscope.

10. The specimen assembly of claim 1, wherein:
the dielectric substrate is formed by one or more of polytetrafluoroethylene (PTFE), quartz, glass-reinforced epoxy, beryllia, alumina, or gallium arsenide;
the dielectric substrate has a thickness of 500 µm or less; and
the conductive layer comprises a metal coating over a surface of the dielectric substrate.

11. The specimen assembly of claim 1, wherein:
the dielectric substrate with the conductive layer forms multiple coplanar waveguides, each having first and second leads, and
adjacent ones of the multiple coplanar waveguides share a common second lead between the corresponding first leads.

12. A method for in situ transmission electron microscopy (TEM), comprising:
mounting a specimen to a sample carrier, which comprises a dielectric substrate with a conductive layer that forms a coplanar waveguide configured to transmit an electrical signal to a specimen held by the sample carrier, the coplanar waveguide having a first lead formed by the conductive layer and a pair of second leads formed by the conductive layer, the first lead being between the second leads and spaced from the second leads by respective gaps;
mounting the sample carrier to a TEM sample holder, which comprises a head portion, a back end portion, and a shaft portion between the head and back end portions, the sample carrier being disposed within a recess of the head portion;
installing the TEM sample holder to a transmission electron microscope such that the sample carrier with specimen is disposed within a vacuum environment of the microscope;
connecting a radio-frequency (RF) source to a connector of the TEM sample holder; and
applying one or more electrical signals from the RF source to the specimen within the transmission electron microscope via the TEM sample holder and the sample carrier, each electrical signal having a frequency between 3 kHz and 300 GHz, inclusive.

13. The method of claim 12, further comprising:
at a same time as or in response to the applying one or more electrical signals, irradiating the specimen with an electron beam and detecting the electron beam after passing through the specimen to form a TEM image.

14. The method of claim 12, wherein the mounting the specimen comprises wirebonding a wire between a first lead of the sample carrier and a terminal of the specimen.

15. The method of claim 12, wherein the mounting the sample carrier to the TEM sample holder comprises coupling coaxial cabling, which extends from the connector through the shaft portion to the head portion of the TEM sample holder, to at least the first lead.

16. The method of claim 12, wherein the dielectric substrate with the conductive layer forms multiple coplanar waveguides, each having first and second leads, and adjacent ones of the multiple coplanar waveguides share a common second lead between the corresponding first leads.

17. The method of claim 16, wherein the mounting the specimen comprises wirebonding a wire between each first lead of the sample carrier and a corresponding terminal of the specimen.

18. The method of claim 16, wherein:
the connecting comprises connecting the RF source to a plurality of connectors of the TEM sample holder; and
the mounting the sample carrier to the TEM sample holder comprises coupling multiple coaxial cables to the first leads, respectively,
wherein each coaxial cable extends from a respective one of the connectors through the shaft portion to the head portion of the TEM sample holder.

19. A method for in situ transmission electron microscopy (TEM), comprising:
via a sample carrier, applying one or more electrical signals from a radio-frequency (RF) source to a specimen within a vacuum chamber of a transmission electron microscope; and
at a same time or in response to the applying the one or more electrical signals, irradiating the specimen with an electron beam and detecting the electron beam after passing through the specimen,
wherein each electrical signal has a frequency between 3 kHz and 300 GHz, inclusive,
the sample carrier comprises a dielectric substrate with a conductive layer that forms multiple coplanar waveguides for transmitting the one or more electrical signals to the specimen, and
the coplanar waveguides comprise multiple first leads and second leads formed from the conductive layer, each first lead being between and spaced from a pair of adjacent second leads by respective gaps.

20. The method of claim 19, wherein:
the one or more electrical signals are conveyed from the RF source by coaxial cables that extend from outside the vacuum chamber to respective input ends of the first leads within the vacuum chamber, each coaxial cable being disposed within a TEM sample holder,
the sample carrier is mounted to a head portion of the TEM sample holder, and
a back end portion of the TEM sample holder includes RF connectors that connect the RF source to the coaxial cables.

* * * * *